United States Patent
Nakagawa

(10) Patent No.: US 12,184,057 B2
(45) Date of Patent: Dec. 31, 2024

(54) FAILURE DETECTION DEVICE THAT DETECTS FAILURE OF PARALLEL-DRIVEN SWITCH, AND MOTOR DRIVE DEVICE

(71) Applicant: FANUC CORPORATION, Yamanashi (JP)

(72) Inventor: Yuuya Nakagawa, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 209 days.

(21) Appl. No.: 17/999,052

(22) PCT Filed: May 14, 2021

(86) PCT No.: PCT/JP2021/018488
§ 371 (c)(1),
(2) Date: Nov. 17, 2022

(87) PCT Pub. No.: WO2021/235367
PCT Pub. Date: Nov. 25, 2021

(65) Prior Publication Data
US 2023/0178976 A1 Jun. 8, 2023

(30) Foreign Application Priority Data
May 18, 2020 (JP) .................................. 2020-086839

(51) Int. Cl.
*H02H 5/04* (2006.01)
*H02H 1/00* (2006.01)

(52) U.S. Cl.
CPC .......... *H02H 5/042* (2013.01); *H02H 1/0007* (2013.01)

(58) Field of Classification Search
CPC ............ H02H 5/04; H02H 1/00; H02H 5/042; H02H 1/0007; G01R 31/3278; H01H 47/22; H01H 50/44; H02J 9/061
USPC ........................................ 361/93.7–93.9, 103
See application file for complete search history.

(56) References Cited

U.S. PATENT DOCUMENTS 5,627,738 A * 5/1997 Lubomirsky .......... H02H 9/001
361/58
6,094,013 A * 7/2000 Goller .................... H02H 9/002
361/57

FOREIGN PATENT DOCUMENTS

| JP | 2013211950 A | 10/2013 |
|----|--------------|---------|
| JP | 5743944 B2 | 7/2015 |
| KR | 1020170099287 A | 8/2017 |

* cited by examiner

*Primary Examiner* — Danny Nguyen
(74) *Attorney, Agent, or Firm* — HAUPTMAN HAM, LLP

(57) ABSTRACT

The failure detection device detects failure in switches that are selectively switched between conduction and non-conduction in a current path, and includes: two or more temperature sensors in which a resistance value between terminals changes in accordance with temperature changes, the two or more temperatures sensors being provided near two or more of the switches connected to each other in parallel, and the two or more temperatures sensors being electrically connected in series to each other; a detection unit that detects the combined resistance value of the two or more temperature sensors; and a determination unit that determines, based on a combined resistance value, that one or more of the two or more switches has failed.

7 Claims, 8 Drawing Sheets

FAILURE DETECTION DEVICE THAT DETECTS FAILURE OF PARALLEL-DRIVEN SWITCH, AND MOTOR DRIVE DEVICE

RELATED APPLICATIONS

The present application is a National Phase of International Application No. PCT/JP2021/018488 filed May 14, 2021, which claims priority to Japanese Application No. 2020-086839, filed May 18, 2020.

TECHNICAL FIELD

The present invention relates to a failure detection device that detects a failure of parallel-driven switches and a motor drive device.

BACKGROUND ART

As switches selectively switched between conduction (also called "closed" or "ON") and nonconduction (also called "open" or "OFF") in a current path, a relay, a semiconductor switching device, and a magnetic contactor, for example, are used. When switching between conduction and nonconduction in a current path through which a high current flows is implemented using a switch having a low rated current, such switches are connected in parallel with each other and driven in parallel. In such parallel driving, a high current is distributed and supplied to each of the parallel switches by simultaneously closing these switches, and is cut off by simultaneously opening these switches.

A power conversion device for outputting AC power having a variable voltage and a variable frequency, for example, is known to be allowed to include a rectifier that rectifies an AC voltage from an AC power supply and converts the AC voltage into a DC voltage, a DC intermediate circuit including a smoothing capacitor that smooths the DC voltage of the rectifier, a current-limiting circuit that limits a charging current flowing into the smoothing capacitor of the DC intermediate circuit, a voltage detection circuit that detects a voltage of the DC intermediate circuit, an inverter that converts the DC voltage of the rectifier into an AC voltage, n temperature detection elements that detect temperatures of n relays, respectively, connected in parallel with a resistor of the current-limiting circuit and arranged on a circuit board having a terminal connected to contact points of the n relays, and a control unit that detects that one of the n relays is abnormal, based on the detection result obtained by each of the temperature detection elements (see, e.g., PTL 1).

CITATIONS LIST

Patent Literature

[PTL 1] Japanese Patent No. 5743944

SUMMARY OF INVENTION

Technical Problem

In a circuit that switches between conduction (closed) and nonconduction (open) in a current path by parallel driving of switches connected in parallel with each other, when a close command is issued to all the switches, but nonetheless a failure (to be referred to as an "open failure" hereinafter) occurs in which at least one switch is not closed but remains open, a current concentrates on the switch normally closed in accordance with the close command, resulting in abnormal overheating. Upon the abnormal overheating due to the open failure, an originally normal switch, a board equipped with this switch, and various electronic components placed in the vicinity of this switch, for example, may be damaged. Therefore, in a circuit in which switches connected in parallel with each other are provided in a current path and driven in parallel, it is desired to prevent abnormal overheating by detecting a failure of the switches.

Solution to Problem

According to one aspect of the present disclosure, a failure detection device configured to detect a failure of a switch selectively switched between conduction and nonconduction in a current path includes at least two temperature sensors having resistance values between terminals that change in response to a change in temperature, the at least two temperature sensors being provided in vicinity of at least two switches connected in parallel with each other, and the at least two temperature sensors being electrically connected in series with each other, a detection unit configured to detect a combined resistance value of the at least two temperature sensors, and a determination unit that determines that a failure has occurred in at least one of the at least two switches, based on the combined resistance value.

According to another aspect of the present disclosure, a motor drive device includes the above-mentioned failure detection device, a converter circuit configured to convert alternating-current power input from an alternating-current power supply into direct-current power and output the direct-current power, a DC link capacitor provided in a DC link located on a direct-current output side of the converter circuit, an inverter circuit configured to convert the direct-current power in the DC link into alternating-current power for motor driving and output the alternating-current power, and a pre-charging circuit including the switches and a pre-charging resistor connected in parallel with the switches, and configured to prevent an inrush current upon pre-charging of the DC link capacitor.

Advantageous Effects of Invention

According to one aspect of the present disclosure, it is possible to implement a failure detection device that prevents abnormal overheating by detecting a failure of switches connected in parallel with each other in a circuit in which the switches are provided in a current path and driven in parallel, and a motor drive device including the failure detection device.

DESCRIPTION OF EMBODIMENTS

Figure 1:
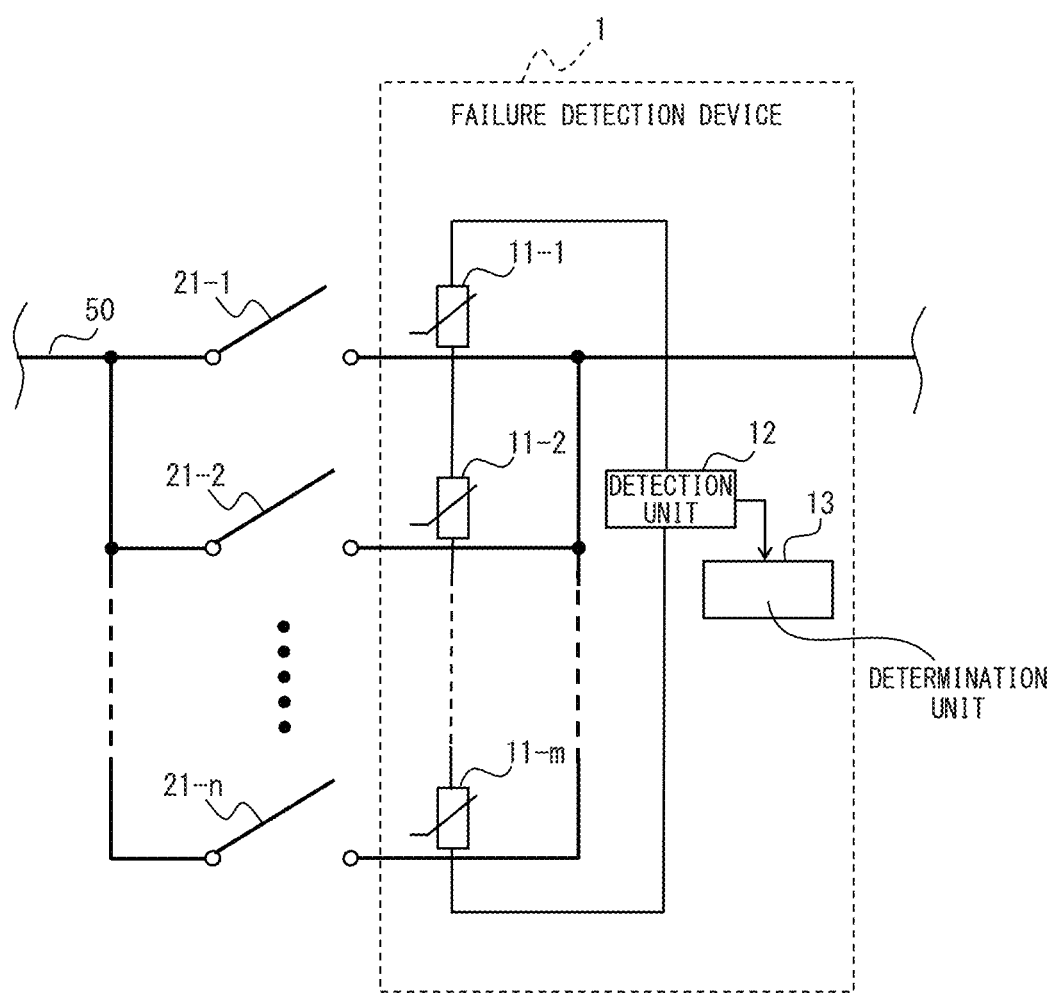
FIG. 1 is a diagram illustrating a failure detection device according to one embodiment of the present disclosure.

A failure detection device configured to detect a failure of switches driven in parallel and a motor drive device will be described below with reference to the drawings. To facilitate understanding, these drawings use different scales as appropriate. The modes illustrated in the drawings are merely examples for carrying out the present invention, which is not limited to the embodiments illustrated in the drawings.

FIG. 1 is a diagram illustrating a failure detection device according to one embodiment of the present disclosure.

A failure detection device 1 according to one embodiment of the present disclosure detects that a failure has occurred in at least one of switches 21-1 to 21-n (n is an integer of 2 or more) connected in parallel with each other in a circuit in which the switches 21-1 to 21-n are provided in a current path 50 and driven in parallel.

The switches 21-1 to 21-n targeted for failure detection by the failure detection device 1 are selectively switched between conduction and nonconduction in the current path 50. Even when each of the switches 21-1 to 21-n individually has a low rated current, such selective switching between conduction (closed) and nonconduction (open) can be implemented in the current path 50, through which a high current flows, by connecting the switches 21-1 to 21-n in parallel with each other and driving them in parallel. In other words, a high current can be distributed and supplied to each of the parallel switches by simultaneously closing these switches, and can be cut off by simultaneously opening these switches. FIG. 1 does not illustrate a control unit that issues close and open commands to the switches 21-1 to 21-n.

Examples of the switches 21-1 to 21-n targeted for failure detection by the failure detection device 1 may include relays, semiconductor switching devices, and magnetic contactors. Examples of the semiconductor switching devices may include FETs, IGBTs, thyristors, GTOs, and transistors.

An example of the circuit including the switches 21-1 to 21-n targeted for failure detection by the failure detection device 1 may be a pre-charging circuit provided in a motor drive device. Although details will be described later, the pre-charging circuit prevents any inrush current that may occur upon pre-charging of a DC link capacitor interposed between the DC output side of a converter circuit and the DC input side of an inverter circuit in the motor drive device. The pre-charging circuit includes a switch and a pre-charging resistor connected in parallel with the switch. Since the switch is closed and a high current flows through the switch after the completion of pre-charging, such a situation is often coped with by connecting such switches in parallel with each other and driving them in parallel. The failure detection device 1 according to the embodiment of the present disclosure can be used for failure detection of such switches driven in parallel in a pre-charging circuit including the switches. Alternatively, the failure detection device 1 may be used for failure detection of such switches provided in a dynamic braking circuit, a converter circuit, or an inverter circuit.

The failure detection device 1 according to the embodiment of the present disclosure includes at least two temperature sensors 11-1 to 11-m (m is an integer of 2 or more), a detection unit 12, and a determination unit 13.

The temperature sensors 11-1 to 11-m serve as elements having their resistance values between terminals that change in response to a change in temperature. Examples of the temperature sensors 11-1 to 11-m may include PTC thermistors that increase in resistance value with rising temperature, and NTC thermistors that decrease in resistance value with rising temperature.

The temperature sensors 11-1 to 11-m are provided on a board, mounted with at least two switches 21-1 to 21-n connected in parallel with each other, in the vicinity of the switches 21-1 to 21-n. The number m of temperature sensors 11-1 to 11-m is equal to or smaller than the number n of switches 21-1 to 21-n. The temperature sensors 11-1 to 11-m are electrically connected in series with each other. Therefore, the combined resistance value of the temperature sensors 11-1 to 11-m connected in series with each other also changes in response to changes in temperature in the vicinity of the switches 21-1 to 21-n and the board mounted with the switches 21-1 to 21-n.

The detection unit 12 detects a combined resistance value of the temperature sensors 11-1 to 11-m. When, for example, m temperature sensors (m is an integer of 2 or more) are electrically connected in series with each other in the order of the first temperature sensor 11-1, . . . , the mth temperature sensor 11-m, the sum of resistance values between the terminal, on the side on which the second temperature sensor is not connected, of the two terminals of the first temperature sensor 11-1 and the terminal, on the side on which the m-1th temperature sensor 11-m+1 is not connected, of the two terminals of the mth temperature sensor 11-m, is defined as the combined resistance value.

Letting $R_1$ to $R_m$ be the resistance values of the temperature sensors 11-1 to 11-m, respectively, the detection unit 12 calculates a combined resistance value RA in accordance with, e.g., equation (1):

[Math. 1]

$$R_A = \sum_{k=1}^{m} R_k \quad (1)$$

The determination unit 13 determines that a failure has occurred in at least one of the switches, based on the combined resistance value detected by the detection unit 12. The details of the determination processing by the determination unit 13 will be described later.

The detection unit 12 and the determination unit 13 may be implemented as a combination of an analog circuit and an arithmetic processing unit, or may be implemented solely as an analog circuit, or may be implemented solely as an arithmetic processing unit. The arithmetic processing unit includes the concepts of, e.g., an IC, an LSI, a CPU, an MPU, and a DSP. For example, the arithmetic processing unit may operate in accordance with a software program for implementing the functions of the detection unit 12 and/or the determination unit 13. As another example, the detection unit 12 may be implemented as a comparator, and the determination unit 13 may be implemented as an LSI. As still another example, the detection unit 12 and the determination unit 13 may be collectively implemented as one LSI.

Figure 2A:
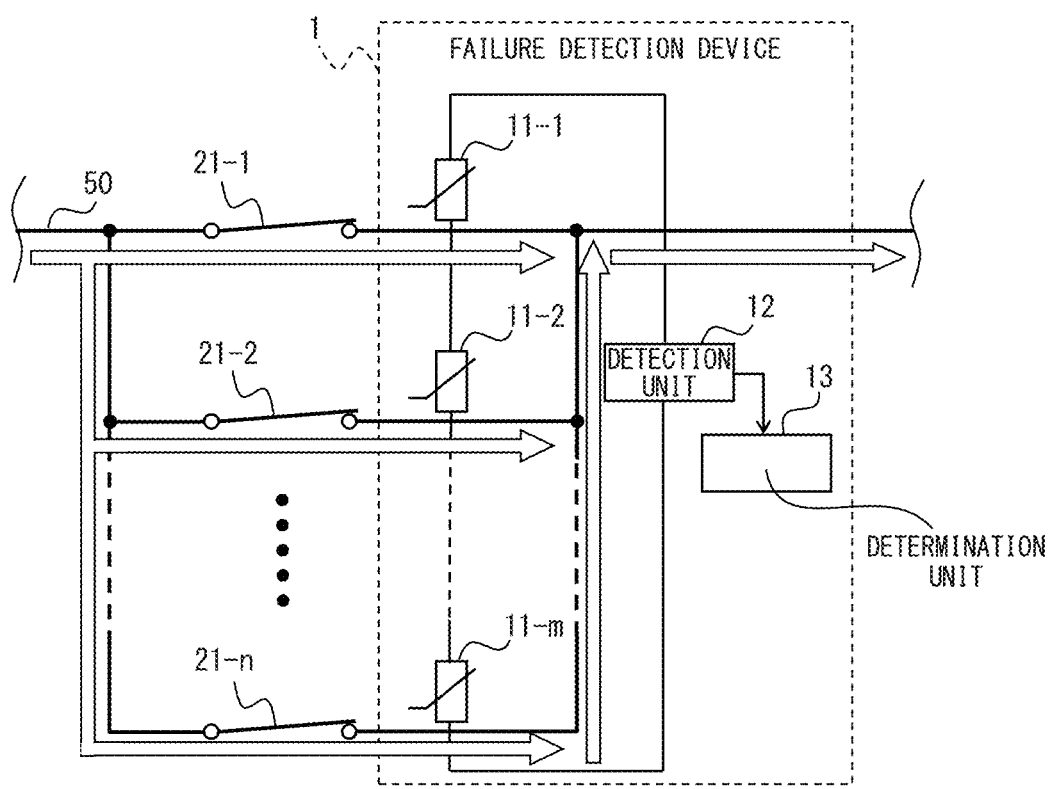
FIG. 2A is a diagram illustrating exemplary current flow in a circuit in which switches connected in parallel with each other are provided in a current path, and depicts the case where all the switches are normally closed in response to a close command, in one embodiment of the present disclosure.
Figure 2B:
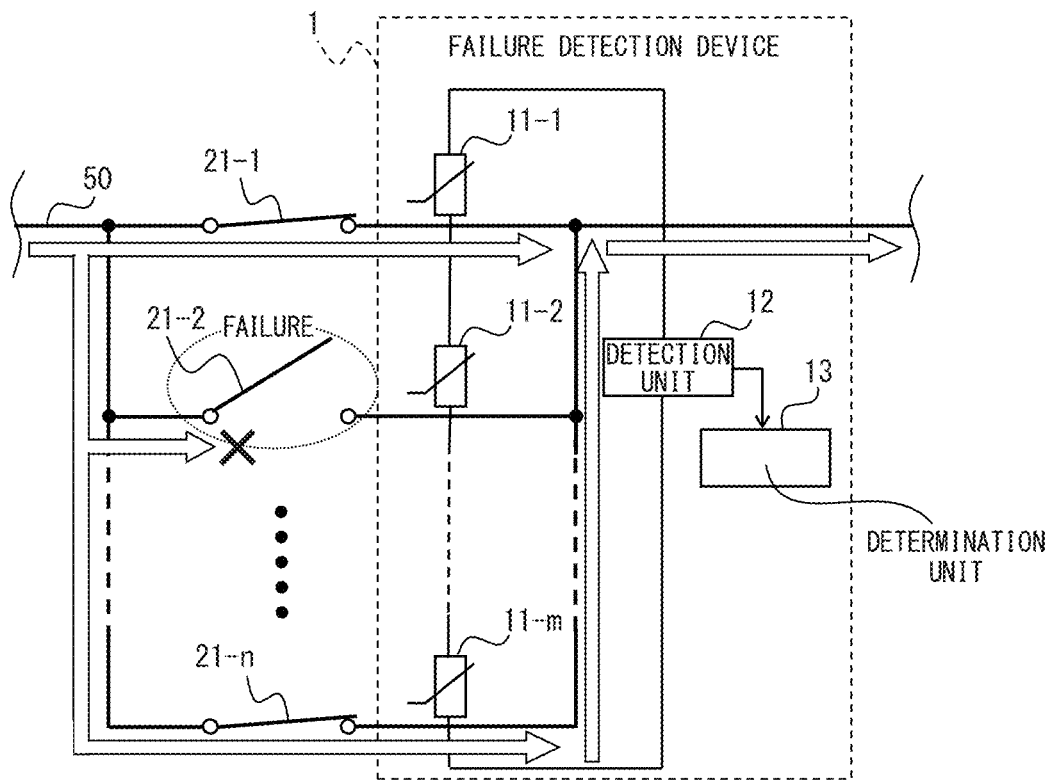
FIG. 2B is a diagram illustrating another exemplary current flow in a circuit in which switches connected in parallel with each other are provided in a current path, and depicts the case where an open failure has occurred in one switch despite a close command, in one embodiment of the present disclosure.

FIG. 2A is a diagram illustrating exemplary current flow in a circuit in which switches connected in parallel with each other are provided in a current path, and depicts the case where all the switches are normally closed in response to a close command, in one embodiment of the present disclosure. FIG. 2B is a diagram illustrating another exemplary current flow in a circuit in which switches connected in parallel with each other are provided in a current path, and depicts the case where an open failure has occurred in one switch despite a close command, in one embodiment of the present disclosure.

As illustrated in FIG. 2A, when all the switches 21-1 to 21-$n$ are normal, the switches 21-1 to 21-$n$ are all closed (conducted) in response to a close command. As a result, since a current flowing through the current path 50 is distributed and flows through the switches 21-1 to 21-$n$, the changes in temperature in the vicinity of the switches 21-1 to 21-$n$ and the board mounted with the switches 21-1 to 21-$n$ are small. Therefore, the change in resistance value of each of the temperature sensors 11-1 to 11-$m$ is also small, and the change in combined resistance value detected by the detection unit 12, in turn, is small.

As illustrated in FIG. 2B, when a close command is issued to all the switches 21-1 to 21-$n$, but nonetheless an open failure occurs in which the switch 21-2, for example, is not closed but remains open, since the switch 21-2 is set in a nonconductive state in which no current flows, current flow concentrates on normal switches (i.e., switches set in a conductive state) other than the switch 21-2. As a result, the changes in temperature in the vicinity of the normal switches other than the switch 21-2 and the periphery of the board mounted with these normal switches are large. Therefore, the change in resistance value of each temperature sensor provided in the vicinity of the corresponding normal switch among the temperature sensors 11-1 to 11-$m$ is also large, and the change in combined resistance value detected by the detection unit 12, in turn, is large. Referring to FIG. 2B, an open failure occurs in one switch 21-2 as an example, but when an open failure occurs in a plurality of switches, since current flow more considerably concentrates on normal switches other than the plurality of switches, the changes in temperature in the vicinity of the normal switches are larger, and therefore the change in resistance value of each temperature sensor provided in the vicinity of the corresponding normal switch is also larger, and the change in combined resistance value detected by the detection unit 12, in turn, is larger.

In this manner, when an open failure occurs in some of the switches 21-1 to 21-$n$, the combined resistance value detected by the detection unit 12 considerably changes from that in the normal state. In view of this, the determination unit 13 compares the combined resistance value detected by the detection unit 12 with a predefined threshold, and determines whether a failure has occurred in at least one of the switches 21-1 to 21-$n$, based on the comparison result.

The determination processing by the determination unit 13 differs depending on whether the temperature sensors 11-1 to 11-$m$ are implemented as PTC thermistors or NTC thermistors. The details of the determination processing by the determination unit 13 will be described below, separately for a first mode in which each of the temperature sensors 11-1 to 11-$m$ is implemented as a PTC thermistor, and a second mode in which each of the temperature sensors 11-1 to 11-$m$ is implemented as an NTC thermistor.

The first mode in which a PTC thermistor is used as each of the temperature sensors 11-1 to 11-$m$ in the failure detection device 1 according to one embodiment of the present disclosure will be described first.

Figure 3:
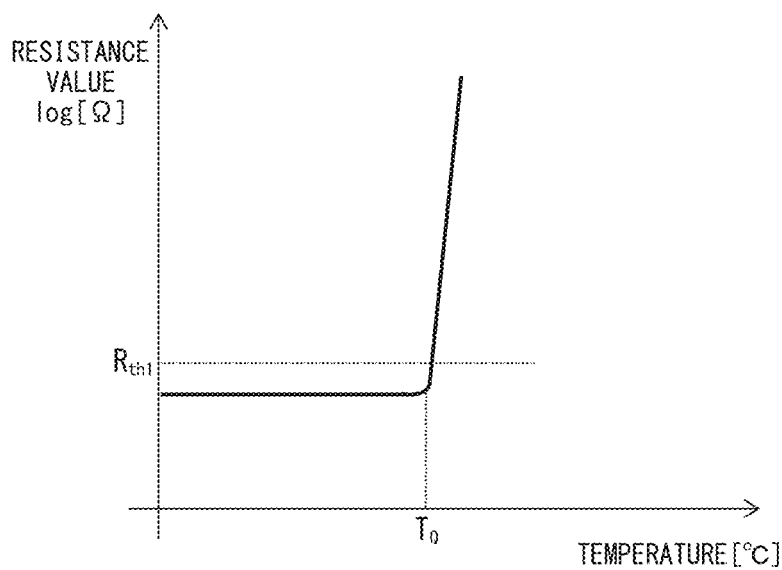
FIG. 3 is a graph illustrating an exemplary resistance vs. temperature characteristic of a PTC thermistor.

FIG. 3 is a graph illustrating an exemplary resistance vs. temperature characteristic of a PTC thermistor.

The PTC thermistor serves as an element having its resistance value that is almost constant at temperatures lower than a Curie temperature $T_Q$ and rapidly increases as the Curie temperature $T_Q$ is exceeded. When PTC thermistors are electrically connected in series with each other, the combined resistance value of the series PTC thermistors rapidly increases as the temperature in the vicinity of at least one PTC thermistor simply exceeds the Curie temperature $T_Q$. Hence, the resistance vs. temperature characteristic illustrated in FIG. 3 can be interpreted not only to represent the relationship between the temperature and the resistance value of one PTC thermistor, but also to represent the relationship between the temperature and the combined resistance value of the series PTC thermistors.

In the first mode in which a PTC thermistor is used as each of the temperature sensors 11-1 to 11-$m$ in the failure detection device 1 according to the embodiment of the present disclosure, the threshold compared with the combined resistance value of the temperature sensors 11-1 to 11-$m$ in the determination processing by the determination unit 13 may be preferably set as follows. The threshold used for the determination processing by the determination unit 13 in the first mode will be referred to as a "first threshold" hereinafter.

In the first mode, as for the PTC thermistors used as the temperature sensors 11-1 to 11-$m$, PTC thermistors having a Curie temperature $T_Q$ equal to or lower than a temperature at which a failure is determined to have occurred (i.e., a temperature generated upon abnormal overheating) are selected. The temperature sensors 11-1 to 11-$m$ are preferably individually implemented as PTC thermistors having the same temperature vs. resistance value characteristic. The "temperature at which a failure is determined to have occurred" may be preferably selected in consideration of, e.g., the heat-resistance temperatures of the switches 21-1 to 21-$n$, the heat-resistance temperature of the board mounted with the switches 21-1 to 21-$n$, the heat-resistance temperatures of various components placed in the vicinity of the switches 21-1 to 21-$n$, and the heat-resistance temperature of the board mounted with the switches 21-1 to 21-$n$ and the various components. As described above, since the changes in temperature in the vicinity of normal switches other than a switch suffering an open failure and the periphery of the board mounted with the normal switches are large, the resistance values of PTC thermistors placed in the vicinity of the normal switches rapidly increase. As the resistance values of the PTC thermistors placed in the vicinity of the normal switches rapidly increase, the combined resistance value of PTC thermistors connected in series with each other, naturally, also rapidly increases. In the first mode, a resistance value obtained by adding, for safety, a slight margin to a resistance value corresponding to the Curie temperature $T_Q$ of one PTC thermistor is set as a first threshold $R_{th1}$. The determination unit 13 determines whether an open failure has occurred, based on the comparison result between the first threshold $R_{th1}$ and the combined resistance value detected by the detection unit 12. In other words, the determination unit 13 determines that an open failure that leads to a rapid increase in combined resistance value of the series PTC thermistors (temperature sensors 11-1 to 11-*m*) has occurred when the combined resistance value of the PTC thermistors (temperature sensors 11-1 to 11-*m*) has exceeded the first threshold $R_{th1}$. The first threshold $R_{th1}$ may be stored in a rewritable storage unit (not illustrated) and allowed to be rewritten by an external device, and this makes it possible to change the first threshold $R_{th1}$ to an appropriate value as appropriate even after the first threshold $R_{th1}$ is temporarily set.

Figure 4:
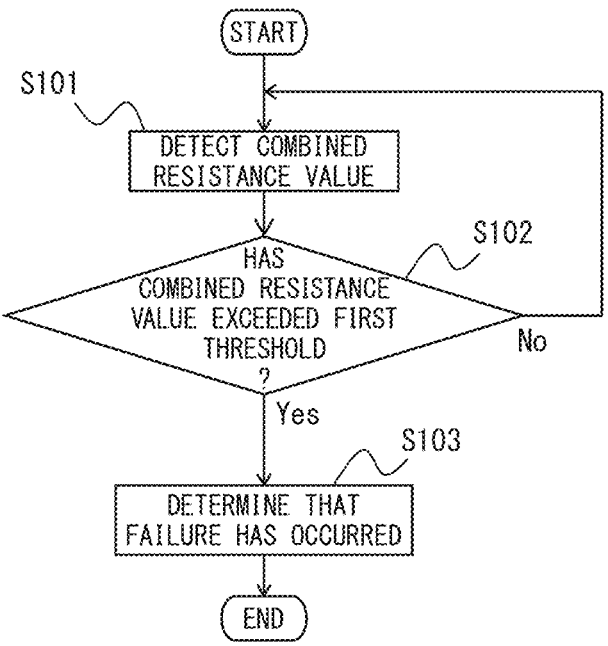
FIG. 4 is a flowchart illustrating the operation sequence of a failure detection device according to a first mode in which a PTC thermistor is used as a temperature sensor.

FIG. 4 is a flowchart illustrating the operation sequence of a failure detection device according to a first mode in which a PTC thermistor is used as a temperature sensor.

In a circuit in which the parallel switches 21-1 to 21-*n* illustrated in FIG. 1 are provided in the current path 50 and driven in parallel, in step S101 the detection unit 12 detects a combined resistance value of the temperature sensors 11-1 to 11-*m* individually implemented as PTC thermistors. Data concerning the combined resistance value detected by the detection unit 12 is sent to the determination unit 13.

In step S102, the determination unit 13 compares the combined resistance value detected by the detection unit 12 with the first threshold $R_{th1}$, and determines whether the combined resistance value has exceeded the first threshold $R_{th1}$. In step S102, if it is determined that the combined resistance value has exceeded the first threshold $R_{th1}$, the process advances to step S103; or if it is not determined that the combined resistance value has exceeded the first threshold $R_{th1}$, the process returns to step S101. The processes in steps S101 and S102 are repeatedly performed with a predetermined period.

When it is determined in step S102 that the combined resistance value has exceeded the first threshold $R_{th1}$, the determination unit 13 determines in step S103 that a failure has occurred in at least one of the switches 21-1 to 21-*n*.

The second mode in which an NTC thermistor is used as each of the temperature sensors 11-1 to 11-*m* in the failure detection device 1 according to one embodiment of the present disclosure will be described subsequently.

Figure 5:
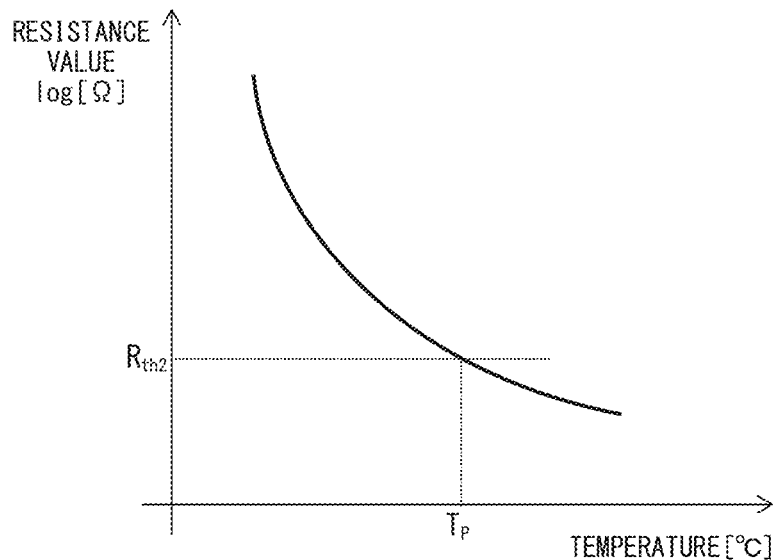
FIG. 5 is a graph illustrating an exemplary resistance vs. temperature characteristic of an NTC thermistor.

FIG. 5 is a graph illustrating an exemplary resistance vs. temperature characteristic of an NTC thermistor.

The NTC thermistor serves as an element that decreases in resistance value with rising temperature. When NTC thermistors are electrically connected in series with each other, the combined resistance value of the series NTC thermistors decreases as the temperature in the vicinity of at least one NTC thermistor rises. The resistance vs. temperature characteristic illustrated in FIG. 5 represents the relationship between the temperature and the combined resistance value of the series NTC thermistors.

In the second mode in which an NTC thermistor is used as each of the temperature sensors 11-1 to 11-*m* in the failure detection device 1 according to the embodiment of the present disclosure, the threshold compared with the combined resistance value of the temperature sensors 11-1 to 11-*m* in the determination processing by the determination unit 13 may be preferably set as follows. The threshold used for the determination processing by the determination unit 13 in the second mode will be referred to as a "second threshold" hereinafter.

To implement the failure detection device 1 according to the embodiment of the present disclosure using the temperature sensors 11-1 to 11-*m* implemented as NTC thermistors, NTC thermistors may be preferably selected so that the combined resistance value of NTC thermistors connected in series with each other when an open failure has occurred in at least one of the switches 21-1 to 21-*n* is smaller than the combined resistance value of the series NTC thermistors when all the switches 21-1 to 21-*n* are normal. As long as, for example, the temperature sensors 11-1 to 11-*m* are individually implemented as NTC thermistors having the same temperature vs. resistance value characteristic, it is easy to implement a failure detection device 1 that satisfies the above-mentioned relationship between the combined resistance value upon the occurrence of an open failure and the combined resistance value in the normal state.

The larger the number of NTC thermistors that have reached a temperature at which a failure is determined to have occurred (i.e., a temperature generated upon abnormal overheating), the smaller the combined resistance value of the series NTC thermistors (temperature sensors 11-1 to 11-*m*). In the second mode, a resistance value obtained by adding, for safety, a slight margin to the combined resistance value of the series NTC thermistors (temperature sensors 11-1 to 11-*m*) when, for example, one NTC thermistor has reached the "temperature at which a failure is determined to have occurred" is set as a second threshold $R_{th2}$ in consideration of, e.g., the heat-resistance temperatures of the switches 21-1 to 21-*n*, the heat-resistance temperature of the board mounted with the switches 21-1 to 21-*n*, the heat-resistance temperatures of various components placed in the vicinity of the switches 21-1 to 21-*n*, and the heat-resistance temperature of the board mounted with the switches 21-1 to 21-*n* and the various components. The determination unit 13 determines whether an open failure has occurred, based on the comparison result between the second threshold $R_{th2}$ and the combined resistance value detected by the detection unit 12. In other words, the determination unit 13 determines that an open failure that leads to a decrease in combined resistance value of at least the NTC thermistors (temperature sensors 11-1 to 11-*m*) has occurred when the combined resistance value of the series NTC thermistors (temperature sensors 11-1 to 11-*m*) has fallen below the second threshold $R_{th2}$. The second threshold $R_{th2}$ may be stored in a rewritable storage unit (not illustrated) and allowed to be rewritten by an external device, and this makes it possible to change the second threshold $R_{th2}$ to an appropriate value as appropriate even after the second threshold $R_{th2}$ is temporarily set.

Figure 6:
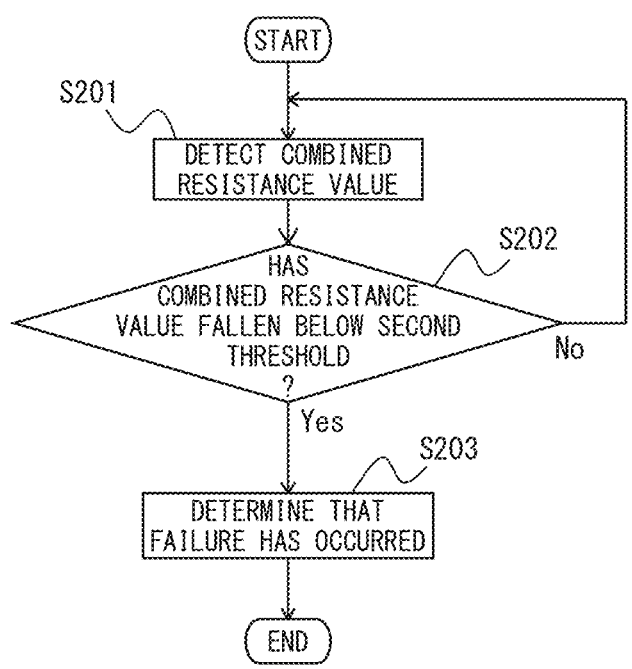
FIG. 6 is a flowchart illustrating the operation sequence of a failure detection device according to a second mode in which an NTC thermistor is used as a temperature sensor.

FIG. 6 is a flowchart illustrating the operation sequence of a failure detection device according to a second mode in which an NTC thermistor is used as a temperature sensor.

In a circuit in which the parallel switches 21-1 to 21-*n* illustrated in FIG. 1 are provided in the current path 50 and driven in parallel, in step S201, the detection unit 12 detects a combined resistance value of the temperature sensors 11-1 to 11-*m* individually implemented as NTC thermistors. Data concerning the combined resistance value detected by the detection unit 12 is sent to the determination unit 13.

In step S202, the determination unit 13 compares the combined resistance value detected by the detection unit 12 with the second threshold $R_{th2}$, and determines whether the combined resistance value has fallen below the second threshold $R_{th2}$. In step S202, if it is determined that the combined resistance value has fallen below the second threshold $R_{th2}$, the process advances to step S203; or if it is not determined that the combined resistance value has fallen below the second threshold $R_{th2}$, the process returns to step S201. The processes in steps S201 and S202 are repeatedly performed with a predetermined period.

When it is determined in step S202 that the combined resistance value has fallen below the second threshold $R_{th2}$, the determination unit 13 determines in step S203 that a failure has occurred in at least one of the switches 21-1 to 21-*n*.

In both the above-described first mode and second mode, the failure determination result obtained by the determination unit 13 may be displayed on, e.g., a display unit. Examples of the display unit may include an independent display device, and display devices attached to a personal computer and a portable terminal. Alternatively, the failure determination result obtained by the determination unit 13 may be output from an acoustic device that emits a sound like that produced by, e.g., a voice, a loudspeaker, a buzzer, or a chime. With this operation, an operator can know that a failure has occurred in at least one of the switches 21-1 to 21-*n*. Hence, the operator can take a measure such as replacement or repairing of all the switches 21-1 to 21-*n*, or replacement or repairing of the board or the various components.

Again, in both the above-described first mode and second mode, a machine including the circuit equipped with the parallel switches 21-1 to 21-*n* illustrated in FIG. 1 may be brought to an emergency stop or may be made to perform an abnormality avoidance operation, based on the failure determination result obtained by the determination unit 13. Further, the determination result obtained by the determination unit 13 may be recorded in a storage device and made ready for later use.

In the above-described embodiment, the temperature sensors 11-1 to 11-*m* are electrically connected in series with each other, the detection unit 12 detects a combined resistance value of the series temperature sensors 11-1 to 11-*m*, and the determination unit 13 detects the occurrence of an open failure, based on the detected combined resistance value. As a modification to this embodiment, the temperature sensors 11-1 to 11-*m* may be connected in parallel with each other via respective terminals, and the detection unit 12 may detect a combined resistance value of the parallel temperature sensors 11-1 to 11-*m*. Letting $R_1$ to $R_m$ be the resistance values of the parallel temperature sensors 11-1 to 11-*m*, respectively, the detection unit 12 calculates a combined resistance value RB in accordance with, e.g., equation (2). The determination unit 13 may detect the occurrence of an open failure, based on the combined resistance value RB.

[Math. 2]

$$\frac{1}{R_B} = \sum_{k=1}^{m} \frac{1}{R_k} \quad (2)$$

Exemplary placement of temperature sensors in the failure detection device according to one embodiment of the present disclosure will be described below by taking a pre-charging circuit as an example.

Figure 7:
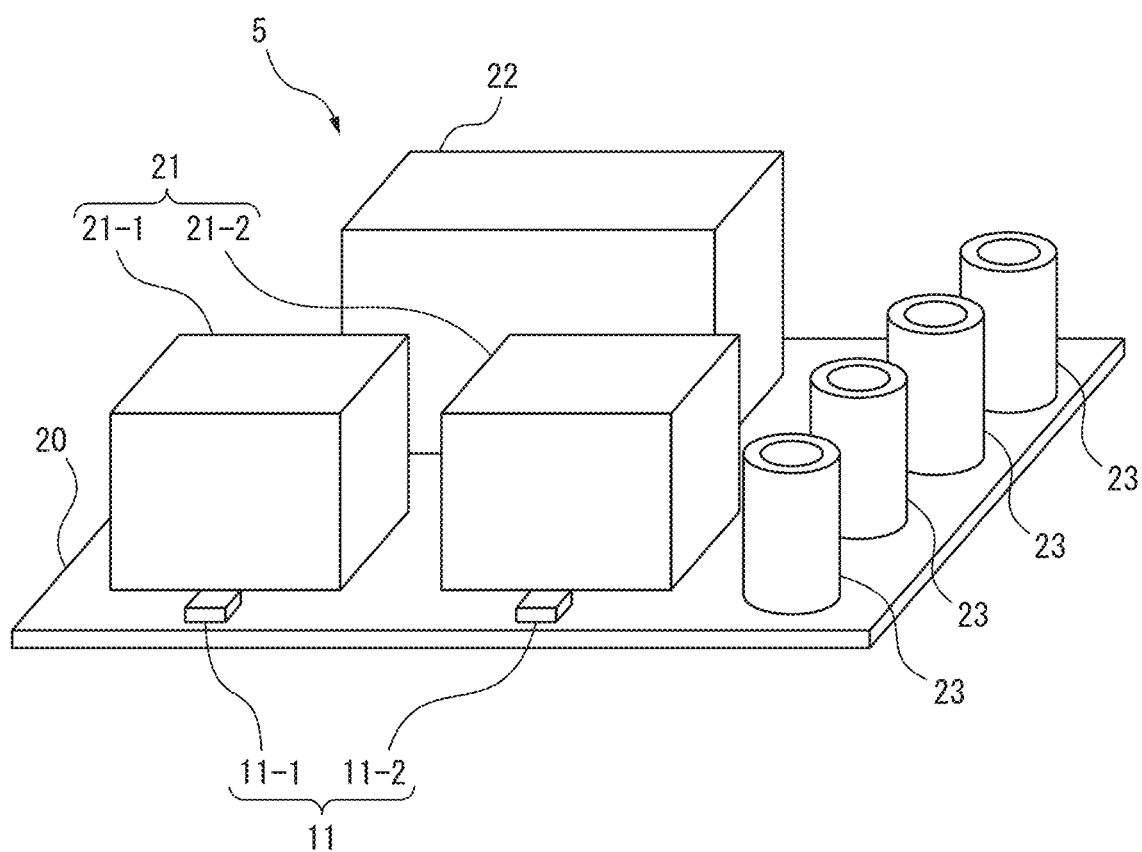
FIG. 7 is a perspective view illustrating an exemplary pre-charging circuit equipped with temperature sensors in the failure detection device according to one embodiment of the present disclosure.
Figure 8:
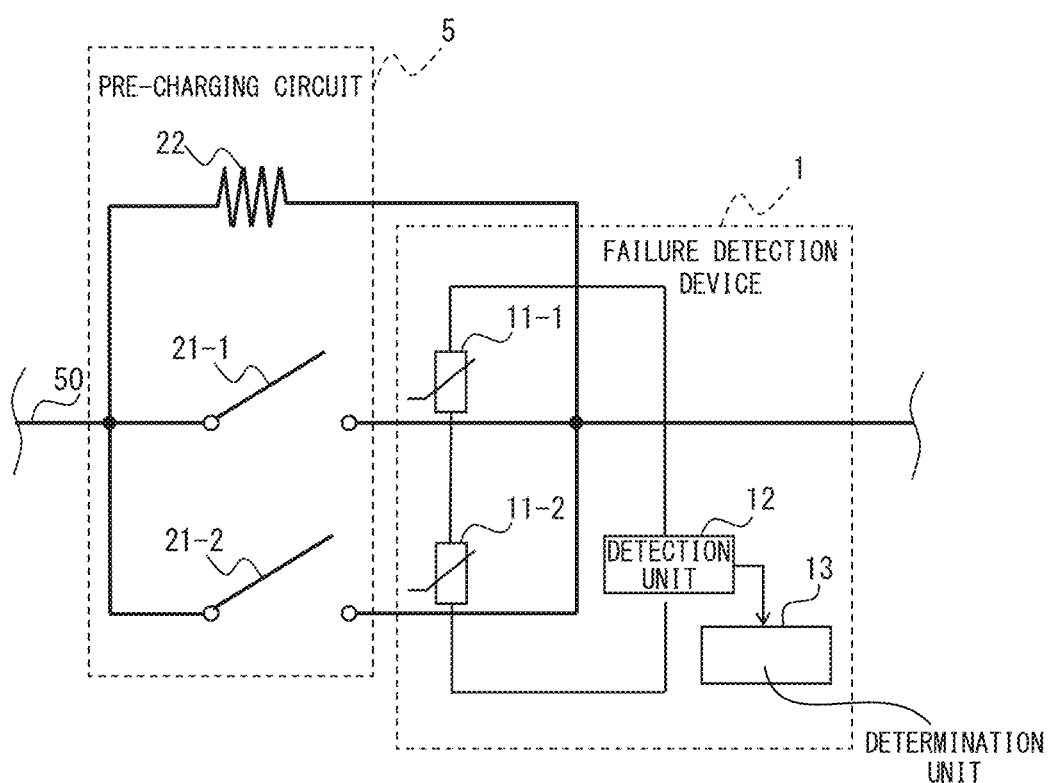
FIG. 8 is a circuit diagram illustrating the exemplary pre-charging circuit equipped with the temperature sensors in the failure detection device according to one embodiment of the present disclosure.

FIG. 7 is a perspective view illustrating an exemplary pre-charging circuit equipped with temperature sensors in the failure detection device according to one embodiment of the present disclosure. FIG. 8 is a circuit diagram illustrating the exemplary pre-charging circuit equipped with the temperature sensors in the failure detection device according to one embodiment of the present disclosure. The case where two switches are provided in a pre-charging circuit 5 will be described below as an example with reference to FIGS. 7 and 8.

The pre-charging circuit 5 provided in a motor drive device prevents any inrush current that may occur upon pre-charging of a DC link capacitor interposed between the DC output side of a converter circuit and the DC input side of an inverter circuit in the motor drive device. The pre-charging circuit is provided on the DC output side or the AC input side of the converter circuit.

The pre-charging circuit 5 includes switches 21-1 and 21-2 and a pre-charging resistor 22 connected in parallel with the switches 21-1 and 21-2, as illustrated in FIG. 8. Examples of the switches 21-1 and 21-2 may include relays and semiconductor switching devices. Since the switch 21 is closed and a high current flows through the switch 21 after the completion of pre-charging, the switch 21 is formed by the switches 21-1 and 21-2 connected in parallel with each other. A high current can be distributed and supplied to each of the parallel switches 21-1 and 21-2 by simultaneously closing the switches 21-1 and 21-2, and can be cut off by simultaneously opening the switches 21-1 and 21-2.

The switches 21-1 and 21-2 and the pre-charging resistor 22 of the pre-charging circuit 5 are mounted on a board 20, as illustrated in FIG. 7. Various components 23 are further provided on the board 20. Examples of the various components 23 may include heat-sensitive capacitors. Temperature sensors 11-1 and 11-2 are provided in the vicinity of the switches 21-1 and 21-2, respectively. As a modification to this embodiment, temperature sensors 11-1 and 11-2 may be provided in the vicinity of the heat-sensitive capacitors.

A motor drive device including the failure detection device according to one embodiment of the present disclosure will be described below.

Figure 9:
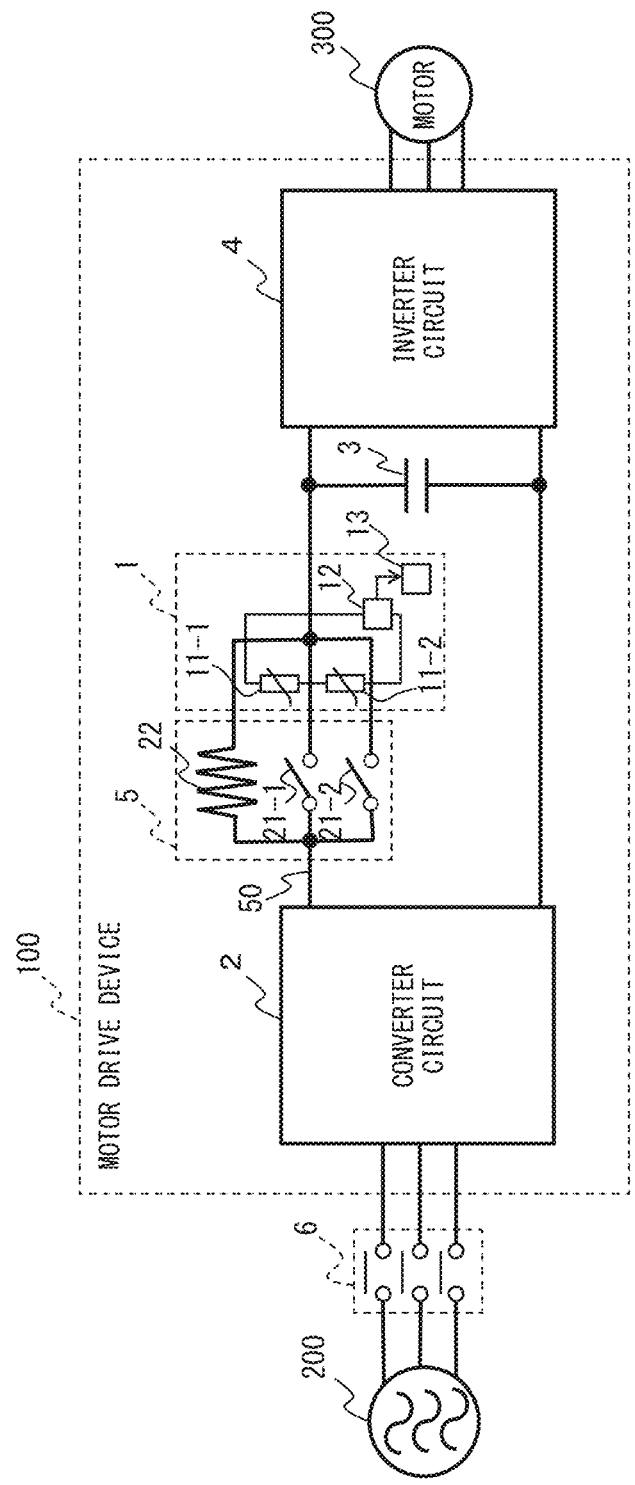
FIG. 9 is a diagram illustrating an exemplary motor drive device including the failure detection device according to one embodiment of the present disclosure.

FIG. 9 is a diagram illustrating an exemplary motor drive device including the failure detection device according to one embodiment of the present disclosure.

The case where a motor 300 is controlled by a motor drive device 100 connected to an AC power supply 200 will be described below as an example. In this embodiment, the type of motor 300 is not particularly limited to any specific type, and may be implemented as, e.g., an induction motor or a synchronous motor. The numbers of phases of the AC power supply 200 and the motor 300 do not particularly limit this embodiment, and a three- or single-phase configuration, for example, may be used. In the example illustrated in FIG. 9, each of the AC power supply 200 and the motor 300 has a three-phase configuration. Examples of the AC power supply 200 may include a 400-V three-phase AC power supply, a 200-V three-phase AC power supply, a 600-V three-phase AC power supply, and a 100-V single-phase AC power supply. Machines equipped with motors 300 include, e.g., a machine tool, a robot, a forging machine, an injection molding machine, and an industrial machine.

The motor drive device 100 includes a failure detection device 1, a converter circuit 2, a DC link capacitor 3, an inverter circuit 4, and a pre-charging circuit 5. A magnetic contactor 6 is interposed between the motor drive device 100 and the AC power supply 200.

The failure detection device 1 has been described above with reference to FIGS. 1 to 8.

The converter circuit 2 converts AC power input from the AC power supply 200 into DC power and outputs the DC power to a DC link located on the DC output side. The "DC link" is also called, e.g., a "DC link portion," a "direct-current link," a "direct-current link portion," or a "direct-current intermediate circuit." The converter circuit 2 is embodied as a three-phase bridge circuit when three-phase AC power is supplied from the AC power supply 200, and is embodied as a single-phase bridge circuit when single-phase AC power is supplied from the AC power supply 200. In the example illustrated in FIG. 9, since the AC power supply 200 is designed as a three-phase AC power supply, the converter circuit 2 is embodied as a three-phase bridge circuit. Examples of the converter circuit 2 may include a diode rectifier, a 120-degree conduction rectifier, and a PWM switching control rectifier. When, for example, the converter circuit 2 serves as a 120-degree conduction rectifier and a PWM switching control rectifier, it is embodied as a bridge circuit of semiconductor switching devices and diodes connected in antiparallel with the semiconductor switching devices, and performs bidirectional AC/DC power conversion by ON/OFF control of each switching device in accordance with a drive command received from a host controller (not illustrated). In this case, examples of the switching devices may include FETs, IGBTs, thyristors, GTOs, and transistors, but other types of semiconductor switching devices may be used.

The magnetic contactor 6 is provided on the AC input side of the converter circuit 2. The magnetic contactor 6 opens and closes a current path for an AC input current from the AC power supply 200 to the converter circuit 2. A closing operation of forming a current path for an AC input current from the AC power supply 200 to the converter circuit 2 is implemented as the contact point of the magnetic contactor 6 closes, and an opening operation of cutting off the current path of the AC input current from the AC power supply 200 to the converter circuit 2 is implemented as the contact point of the magnetic contactor 6 opens. In addition to the magnetic contactor 6, an AC reactor or an AC line filter, for example, may be provided on the AC input side of the converter circuit 2, but such an AC reactor or an AC line filter is not illustrated in FIG. 9.

The DC link capacitor 3 is provided in the DC link that connects the DC output side of the converter circuit 2 and the DC input side of the inverter circuit 4 to each other. The DC link capacitor 3 has a function for storing DC power used to generate AC power by the inverter circuit 4, and a function for suppressing pulsation of the DC output of the converter circuit 2. Examples of the DC link capacitor 3 may include an electrolytic capacitor and a film capacitor.

The inverter circuit 4 is connected to the converter circuit 2 via the DC link, and converts the DC power in the DC link into AC power for motor driving and outputs the AC power. Examples of the inverter circuit 4 may include a PWM control inverter formed by a bridge circuit of a rectifying element and a semiconductor switching device connected in antiparallel with the rectifying element. Examples of the semiconductor switching device may include an FET, an IGBT, a thyristor, a GTO, and a transistor, but other types of semiconductor devices may be used. The inverter circuit 4 is embodied as a three-phase bridge circuit when the motor 300 is designed as a three-phase AC motor, and is embodied as a single-phase bridge circuit when the motor 300 is designed as a single-phase AC motor. In the example illustrated in FIG. 9, since the motor 300 is designed as a three-phase AC motor, the inverter circuit 4 is embodied as a three-phase bridge circuit. The inverter circuit 4 converts the DC power in the DC link into AC power for motor driving and outputs the AC power, by PWM control of the ON and OFF operations of the internal semiconductor switching device, based on a command from a host controller (not illustrated). The motor 300 has its speed, torque, or rotor position controlled based on the AC power supplied from the inverter circuit 4. The inverter circuit 4 can even convert AC power regenerated by the motor 300 into DC power and return the DC power to the DC link on the DC side, by appropriate PWM control of the ON and OFF operations of the switching device.

To prevent any inrush current that may occur upon pre-charging (initial charging) of the DC link capacitor 3 performed before the start of driving of the motor 300 by the motor drive device 100, the pre-charging circuit (initial charging circuit) 5 is provided. The pre-charging circuit 5 is provided on the DC output side or the AC input side of the converter circuit 2, but in the example illustrated in FIG. 9, the pre-charging circuit 5 is provided on the DC output side of the converter circuit 2 as an example.

The pre-charging circuit 5 includes switches 21-1 and 21-2 and a pre-charging resistor 22 connected in parallel with the switches 21-1 and 21-2. Examples of the switches 21-1 and 21-2 may include relays and semiconductor switching devices. In the example illustrated in FIG. 9, the two switches 21-1 and 21-2 are connected in parallel with each other as an example, but three or more switches may be connected in parallel with each other. A high current can be distributed and supplied to each of the parallel switches 21-1 and 21-2 by simultaneously closing the switches 21-1 and 21-2, and can be cut off by simultaneously opening the switches 21-1 and 21-2.

In a pre-charging period that comes immediately after the start (immediately after power-on) of the motor drive device 100 and before the start of driving of the motor 300, the switches 21-1 and 21-2 are simultaneously opened (turned off) in accordance with an open command received from a host controller (not illustrated). During the pre-charging period, since the switches 21-1 and 21-2 are kept open, a current output from the converter circuit 2 flows into the DC link capacitor 3 as a charging current through the pre-charging resistor 22, and the DC link capacitor 3 is thus charged (pre-charged). In this manner, during the pre-charging period, since a current output from the converter circuit 2 flows through the pre-charging resistor 22, any inrush current can be prevented. When pre-charging is completed as the DC link capacitor reaches a predetermined charging voltage, the switches 21-1 and 21-2 are simultaneously closed (turned on) in accordance with a close command received from the host controller (not illustrated). After the completion of pre-charging, the motor 300 starts to be driven, and a current output from the converter circuit 2 flows toward the inverter circuit 4 and the DC link capacitor 3 through the closed switches 21-1 and 21-2.

Temperature sensors 11-1 and 11-2 are provided on a board, mounted with the switches 21-1 and 21-2, in the vicinity of the switches 21-1 and 21-2, respectively. The failure detection device 1 determines whether the switches 21-1 and 21-2 in the pre-charging circuit 5 include any switch suffering an open failure.

During the pre-charging period, since the switches 21-1 and 21-2 are kept open (OFF), no current flows through the switches 21-1 and 21-2. Therefore, the changes in temperature in the vicinity of the switches 21-1 to 21-n and the board mounted with the switches 21-1 to 21-n are small, and the change in combined resistance value detected by the detection unit 12 in the failure detection device 1 is almost no change. The detection unit 12 detects a combined resistance value of the temperature sensors 11-1 and 11-2, and the determination unit 13 performs failure determination processing based on the combined resistance value detected by the detection unit 12. As has been described with reference to FIGS. 3 and 4, when the temperature sensors 11-1 and 11-2 are implemented as PTC thermistors, since the first threshold $R_{th1}$ is set to a value larger than the combined resistance value obtained when all the switches 21-1 and 21-2 are normal, the determination unit 13 does not determine that the combined resistance value detected by the detection unit 12 has exceeded the first threshold $R_{th1}$, and therefore does not determine that an open failure has occurred. As has been described with reference to FIGS. 5 and 6, when the temperature sensors 11-1 and 11-2 are implemented as NTC thermistors, since the second threshold $R_{th2}$ is set to a value smaller than the combined resistance value obtained when all the switches 21-1 and 21-2 are normal, the determination unit 13 does not determine that the combined resistance value detected by the detection unit 12 has fallen below the second threshold $R_{th2}$, and therefore does not determine that an open failure has occurred.

After the completion of pre-charging, the host controller (not illustrated) outputs a close command to the switches 21-1 and 21-2.

When both of the switches 21-1 and 21-2 are normally closed in accordance with the close command, a current output from the converter circuit 2 is distributed and flows through the closed switches 21-1 and 21-2. Therefore, the changes in temperature in the vicinity of the switches 21-1 to 21-n and the board mounted with the switches 21-1 to 21-n are small, and the change in combined resistance value detected by the detection unit 12 in the failure detection device 1 is almost no change. As has been described with reference to FIGS. 3 and 4, when the temperature sensors 11-1 and 11-2 are implemented as PTC thermistors, the determination unit 13 does not determine that the combined resistance value detected by the detection unit 12 has exceeded the first threshold $R_{th1}$, and therefore does not determine that an open failure has occurred. As has been described with reference to FIGS. 5 and 6, when the temperature sensors 11-1 and 11-2 are implemented as NTC thermistors, the determination unit 13 does not determine that the combined resistance value detected by the detection unit 12 has fallen below the second threshold $R_{th2}$, and therefore does not determine that an open failure has occurred.

When a close command is issued to all the switches 21-1 and 21-2, but nonetheless an open failure occurs in which at least one of the switches 21-1 and 21-2 is not closed but remains open, a current concentrates on the switch normally closed in accordance with the close command, resulting in abnormal overheating. When this occurs, the resistance value of the temperature sensor provided in the vicinity of the switch suffering abnormal overheating changes considerably. As has been described with reference to FIGS. 3 and 4, when the temperature sensors 11-1 and 11-2 are implemented as PTC thermistors, the determination unit 13 determines that the combined resistance value detected by the detection unit 12 has exceeded the first threshold $R_{th1}$, and therefore determines that an open failure has occurred. As has been described with reference to FIGS. 5 and 6, when the temperature sensors 11-1 and 11-2 are implemented as NTC thermistors, the determination unit 13 determines that the combined resistance value detected by the detection unit 12 has fallen below the second threshold $R_{th2}$, and therefore determines that an open failure has occurred.

In this manner, in the pre-charging circuit 5 including the switches 21-1 and 21-2 driven in parallel, the failure detection device 1 can detect that an open failure has occurred in at least one of the switches 21-1 and 21-2.

The failure determination result obtained by the determination unit 13 in the failure detection device 1 may be displayed on, e.g., a display unit, or may be output from an acoustic device that emits a sound like that produced by, e.g., a voice, a loudspeaker, a buzzer, or a chime. Further, the motor drive device 100 may be brought to an emergency stop, or a machine equipped with the motor drive device 100 may be made to perform an abnormality avoidance operation, based on the failure determination result obtained by the determination unit 13 in the failure detection device 1.

The failure detection device 1 can detect the occurrence of an open failure not only in the pre-charging circuit 5 as described above, but also in a circuit including switches driven in parallel.

For example, when, as illustrated in FIG. 9, the AC power supply 200 has a three-phase configuration, the magnetic contactor 6 also includes contact circuits for the three phases in correspondence with the three phases of the AC power supply 200, and the contact circuits are driven in parallel. A failure detection device 1 that can detect the occurrence of an open failure between contact points in the magnetic contactor 6 can be implemented by providing a temperature sensor in the vicinity of each of the three phases of the contact circuits, electrically connecting the temperature sensors in series with each other, and forming the above-mentioned detection unit 12 and determination unit 13.

As another example, a dynamic braking circuit (not illustrated) for stopping the motor 300 may be provided in the motor drive device 100 illustrated in FIG. 9. The dynamic braking circuit includes relays interposed between the input terminals of the motor 300, and a dynamic braking resistor connected in series with the relays. In applying a dynamic brake, supply of drive power to the motor 300 is cut off, and then the relays are closed to short-circuit the interval between the input terminals of the motor 300 (the interval between the phases of a motor winding). Since the motor 300 has a field flux even when it is electrically disconnected from a power supply, and the motor 300 rotating by inertia acts as a power generator, a thus generated current flows into the dynamic braking resistor through the closed relays, resulting in the occurrence of a deceleration torque in the motor 300. A failure detection device 1 that can detect the occurrence of an open failure of the switches in the dynamic braking circuit can be implemented by providing a temperature sensor in the vicinity of each relay in the dynamic braking circuit, electrically connecting the temperature sensors in series with each other, and forming the above-mentioned detection unit 12 and determination unit 13.

As still another example, a plurality of semiconductor switching devices are provided in the inverter circuit 4 within the motor drive device 100 illustrated in FIG. 9. When the converter circuit 2 serves as a 120-degree conduction rectifier and a PWM switching control rectifier, a plurality of semiconductor switching devices are also provided in the converter circuit 2. A failure detection device 1 that can detect the occurrence of an open failure of the semiconductor switching devices in the inverter circuit 4 or the converter circuit 2 can be implemented by providing a temperature sensor in the vicinity of each semiconductor switching device, electrically connecting the temperature sensors in series with each other, and forming the above-mentioned detection unit 12 and determination unit 13.

REFERENCE SIGNS LIST

1 Failure detection device
2 Converter circuit

3 DC link capacitor
4 Inverter circuit
5 Pre-charging circuit
6 Magnetic contactor
11, 11-1 to 11-*m* Temperature sensor
12 Detection unit
13 Determination unit
20 Board
21, 21-1 to 21-*n* Switch
22 Pre-charging resistor
23 Various components
100 Motor drive device
200 AC power supply
300 Motor

The invention claimed is:

1. A failure detection device configured to detecting a failure of a switch selectively switched between conduction and nonconduction in a current path, the device comprising:
   at least two temperature sensors having resistance values between terminals that change in response to a change in temperature, the at least two temperature sensors being provided in vicinity of at least two switches connected in parallel with each other, and the at least two temperature sensors being electrically connected in series with each other;
   a detection unit configured to detect a combined resistance value of the at least two temperature sensors; and
   a determination unit configured to determine that a failure has occurred in at least one of the switches, based on the combined resistance value.

2. The failure detection device according to claim 1, wherein
   each of the at least two temperature sensors comprises a PTC thermistor that increases in resistance value with rising temperature, and
   the determination unit determines that a failure has occurred in at least one of the switches when the combined resistance value has exceeded a predefined first threshold.

3. The failure detection device according to claim 1, wherein
   each of the at least two temperature sensors comprises an NTC thermistor that decreases in resistance value with rising temperature, and
   the determination unit determines that a failure has occurred in at least one of the switches when the combined resistance value has fallen below a predefined second threshold.

4. The failure detection device according to claim 1, wherein the switches comprise relays.

5. The failure detection device according to claim 1, wherein the switches comprise semiconductor switching devices.

6. The failure detection device according to claim 1, wherein the switches comprise magnetic contactors.

7. A motor drive device comprising:
   the failure detection device according to claim 1;
   a converter circuit configured to convert alternating-current power input from an alternating-current power supply into direct-current power and output the direct-current power;
   a DC link capacitor provided in a DC link located on a direct-current output side of the converter circuit;
   an inverter circuit configured to convert the direct-current power in the DC link into alternating-current power for motor driving and output the alternating-current power; and
   a pre-charging circuit including the switches and a pre-charging resistor connected in parallel with the switches, and configured to prevent an inrush current upon pre-charging of the DC link capacitor.

* * * * *